United States Patent [19]

Yamada et al.

[11] Patent Number: 5,057,889
[45] Date of Patent: Oct. 15, 1991

[54] ELECTRONIC DEVICE INCLUDING THIN FILM TRANSISTOR

[76] Inventors: Katsuhiko Yamada; Toshihiro Saika, both of c/o Canon Kabushiki Kaisha: 30-2, 3-chome, Shimomaruko, Ohta-ku, Tokyo, Japan

[21] Appl. No.: 436,132
[22] Filed: Nov. 14, 1989

Related U.S. Application Data

[63] Continuation of Ser. No. 214,435, Jul. 1, 1988, abandoned.

[30] Foreign Application Priority Data

Jul. 6, 1987 [JP]  Japan .................................. 62-169381

[51] Int. Cl.$^5$ .................................................. H01L 29/78
[52] U.S. Cl. .................................... 357/23.7; 357/23.1; 357/4
[58] Field of Search ......................... 357/4, 23.7, 23.1

[56] References Cited

U.S. PATENT DOCUMENTS

| 4,365,264 | 12/1982 | Mukai | 357/52 |
| 4,532,536 | 7/1985 | Hatanaka | 357/23.7 |
| 4,686,553 | 8/1987 | Possin | 357/23.7 |
| 4,738,749 | 4/1988 | Maurice et al. | 156/652 |
| 4,816,887 | 3/1989 | Sato | 357/42 |

FOREIGN PATENT DOCUMENTS

| 0105406 | 8/1980 | Japan | 331/77 |
| 58-219817 | 6/1985 | Japan | 357/4 |
| 60-186053 | 9/1985 | Japan | 357/4 |
| 61-131481 | 6/1986 | Japan | 357/4 |

Primary Examiner—Andrew J. James
Assistant Examiner—Donald L. Monin, Jr.

[57] ABSTRACT

An electronic device includes a plurality of thin film transistors (TFTs) which commonly use source and drain electrodes and which are arranged in parallel in the channel direction. Each TFT comprises a thin semiconductor film formed on a substrate. A gate insulative layer is arranged between at least one surface of the thin semiconductor film and a gate electrode. A source electrode and a drain electrode are arranged over at least one of the surfaces of the thin semiconductor film. With this electronic device, the parasitic capacitances which are generated among the gage, source, and drain electrodes are constant without depending on the patterning accuracy, and the offset components which are applied to the output signal hardly cause a variation. Thus, the good TFT characteristic is obtained.

23 Claims, 5 Drawing Sheets

ELECTRONIC DEVICE INCLUDING THIN FILM TRANSISTOR

This application is a continuation division, of application Ser. No. 07/214,435 filed July 1, 1988 now abandoned.

BACKGROUND OF THE INVENTION

1. Field of the Invention

The present invention relates to an electronic device including a thin film transistor.

2. Related Background Art

In recent years, the development of a thin film transistor (hereinafter, abbreviated to TFT) in which a polycrystalline of amorphous semiconductor film has been increasingly used mainly as an electronic device having a large area.

Figure 1:
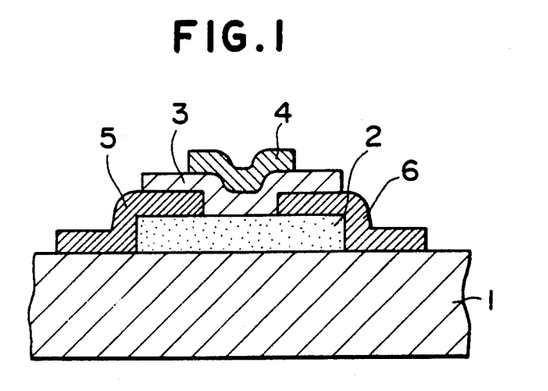
FIGS. 1 and 2 are diagrammatical cross sectional views showing fundamental structures of conventional TFTs.
Figure 2:
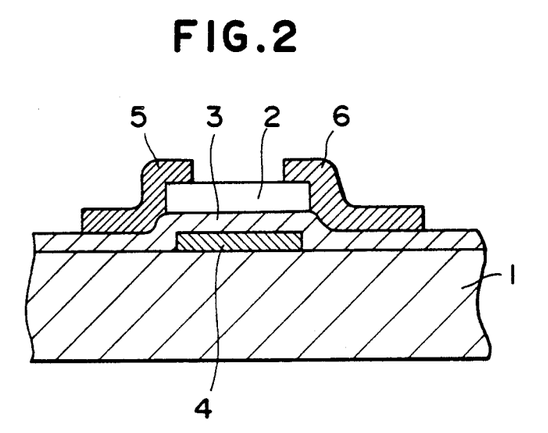

FIGS. 1 and 2 are diagrammatical views showing schematically two fundamental structures of conventional thin film transistors. In these diagrams, reference numeral 1 denotes a substrate; 2 is a thin polycrystalline or amorphous semiconductor film; 3 is a gate insulative film; 4 is a gate electrode; and 5 and 6 are source and drain electrodes. The TFT of FIG. 1 has what is called a coplanar structure (coplanar type) such that the gate electrode 4 source electrode 5, and drain electrode 6 are arranged on the same side of the thin semiconductor film 2. The TFT of FIG. 2 has so-called a stagger structure (stagger type) such that the gate electrode 4 is arranged below the thin semiconductor film 2 and the source electrode 5 and drain electrode 6 are arranged over the film 1.

In the thin film transistors of the above structures, the relative position accuracies among the gate electrode 4 and the source and drain electrodes 5 and 6 are important. Upon patterning of the source and drain electrodes, it is most desirable that the edge of the source and drain electrodes coincide with and are aligned with the edge of the gate electrode. For this purpose, highly accurate mask alignment is necessary. Therefore, hitherto, the gate electrode and the source and drain electrodes are partially overlapped, the positional deviations among them are absorbed by the overlap portions.

However, in the TFTs having the conventional structures mentioned above, the ON/OFF operations are merely assured and the noise components included in the output signal can substantially be controlled at a practical level. That is, a parasitic capacitance which is generated due to the overlap portions among the gate electrode and the source and drain electrode causes a variation depending on the alignment accuracy of a mask used when patterning. Further, there is a case where a large variation is caused in the offset components in the output signal.

SUMMARY OF THE INVENTION

It is an object of the present invention to provide an electronic device including a thin film transistor which can solve the foregoing conventional problems.

Another object of the invention is to provide an electronic device having a plurality of thin film transistors in which the parasitic capacitance which is generated along the respective electrode is constant without depending on a patterning accuracy and a variation in offset components which are applied to an output signal is extremely small or substantially zero.

Still another object of the invention is to provide an electronic device including a plurality of thin film transistors which commonly use a source electrode and a drain electrode and are arranged in parallel in the channel direction, wherein each of the thin film transistors comprises a thin semiconductor film formed on a predetermined substrate, a gate electrode arranged on at least one surface of the thin semiconductor film through a gate insulative film, and a source electrode and a drain electrode which are arranged over either one of the surface of the thin semiconductor film.

DETAILED DESCRIPTION OF THE PREFERRED EMBODIMENTS

The present invention will be described in detail hereinbelow with reference to the drawings.

(First embodiment)

Figure 3A:
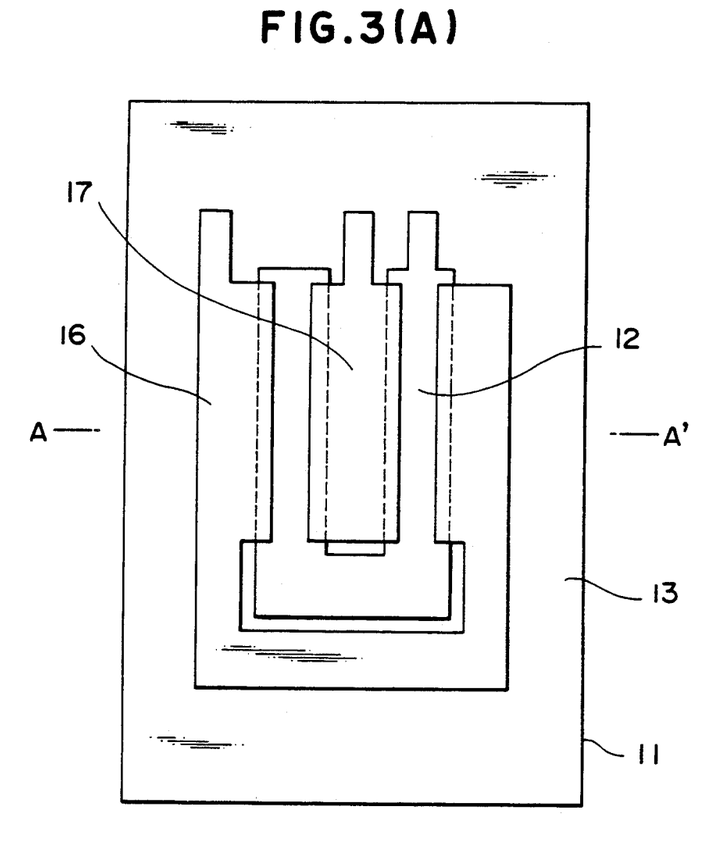
FIG. 3(A) is a schematic plan view showing an embodiment of the present invention.
Figure 3B:
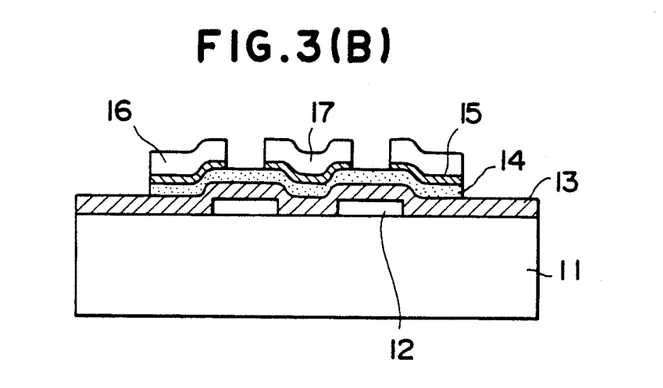
FIG. 3(B) is a cross-sectional view taken along the line A-A' in FIG. 3(A)

FIGS. 3(A) and 3(B) are schematic explanatory diagram showing a fundamental structure of a TFT in one aspect of a preferred embodiment of the invention. FIG. 3(B) is a cross-sectional view of the TFT taken along the line A—A' in FIG. 3(A). In FIG. 3(A), the insulative layer and semiconductor layer are omitted for simplicity of the drawing.

A Cr layer of a thickness of 1000 Å is evaporation deposited onto a transparent glass substrate 11. A gate electrode 12 is formed by patterning. Next, a silicon nitride film (a-SiN film) 13, having a thickness of 3000 Å, is deposited as a gate insulative layer 13 by an RF glow discharge method. Subsequently, an amorphous silicon (a-Si:H) film 14 having a thickness of 5000 Å A is deposited by using the mixture gas of SiH$_4$ and H$_2$. Further, an n$^+$ doping of the amorphous silicon (a Si:H) film into which P ions were doped and which has a thickness of 1500 Å is deposited by using the mixture gas of SiH$_4$, H$_2$ and PH$_3$. Thereafter, aluminum is evaporation deposited thereon. A source electrode 16 and a drain electrode 17 are formed by patterning. The unnecessary n$^+$ amorphous silicon film is then eliminated forming a completed TFT.

In this embodiment, two TFTs which commonly use the source, drain, and gate electrodes are arranged in parallel in the channel direction. Even if the mask alignment upon patterning of the electrodes is deviated in the channel direction during the manufacturing process, the overlap areas among the gate electrode, the source electrode, and the drain electrode do not change. The parasitic capacitance which are generated among those electrodes have constant values. Therefore, the offset components which are applied into the output signal have a value which is substantially equal to the design value without causing a large variation.

The invention is not limited to the foregoing embodiment. That is, the invention can be also applied to such a structure that a plurality of TFTs which commonly use the source electrode, drain electrode, and gate electrode are arranged in parallel in the channel direction and even if the positional accuracy upon patterning of the electrodes is changed in the channel direction, the overlap area between the source electrode and the gate electrode or between the drain electrode and the gate electrode does not change.

A thin amorphous semiconductor film 14 is not limited to a film of Si but can also use a thin amorphous or polycrystalline semiconductor film made of Ge, $Ge_x$-$Si_{1-x}$, $Si_xC_{1-x}$, CdS, CdSe, or the like.

On the other hand, the invention is not limited to the embodiment in which a plurality of stagger type TFTs are arranged in parallel but can be also applied to such a constitution that a plurality of coplanar type TFTs are arranged in parallel.

(Second embodiment)

Figure 4A:
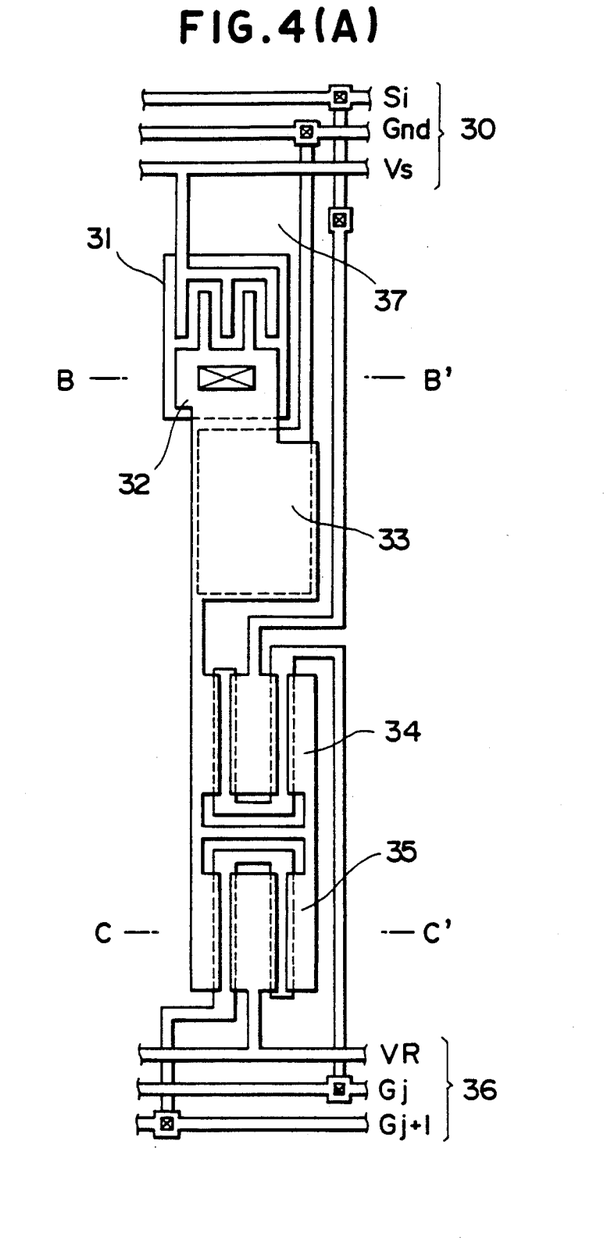
FIGS. 4(A), 4(B) and 4(C) are diagrammatical views of a photoelectric converting apparatus using a TFT according to the invention in another embodiment of the invention and sequentially show a plan view, a cross-sectional view taken along the line B—B' in FIG. 4(A), and a cross sectional view taken along the line C—C' in FIG. 4(A)
Figure 4B:
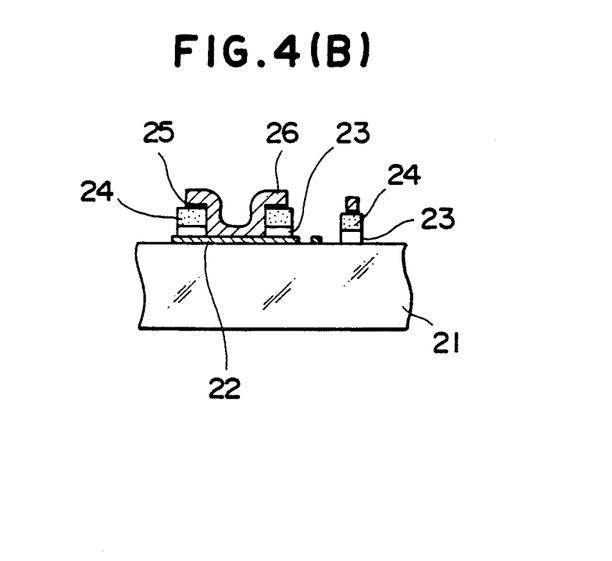
Figure 4C:
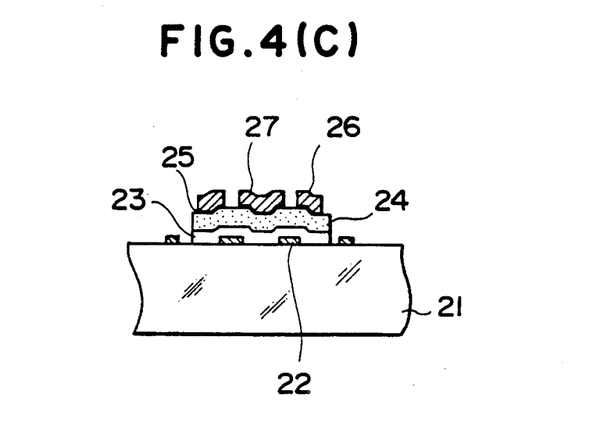

FIGS. 4(A), 4(B) and 4(C) show another preferable embodiment of the invention and illustrate a construction for one bit in the line sensor type photoelectric converting apparatus using the TFT shown in FIGS. 3(A) and 3(B). FIG. 4(A) is a schematic plan view. FIG. 4(B) is a cross-sectional view taken along the line B—B' in FIG. 4(A). FIG. 4(C) is a cross-sectional view taken along the line C—C'.

To avoid the complexity of the drawings, only the upper and lower wiring patterns and contact hole section are shown.

In the diagrams, reference numeral 30 denotes a signal line matrix section; 31 is a photoelectric converting section; 32 a contact hole to connect the gate electrode and source electrode; 33 an accumulating capacitor; 34 a transfer TFT; 35 a reset TFT; and 36 a wiring section of a gate drive line. This example uses what is called a lensless structures such that an original is directly come into contact with a sensor section and the image information of the original is read without using an image forming lens. Therefore, a window 37 to illuminate an original is formed. A lower gate electrode in the sensor section is made of an opaque material and also functions as a light shielding film. The two transfer and reset TFTs 34 and 35 are arranged at the mirror surface in a symmetrical position. This is because when the alignment accuracy of the lower and upper electrode patterns changes in the longitudinal direction of the substrate, capacitance is prevented between the gate and source electrodes of the TFTs by compensating it by the pair of TFTs. The change in the capacitance between the gate and source electrodes in the longitudinal direction of the substrate appears as the offset components of the signal output. A variation of the offset components can be eliminated by using this pattern.

In the diagrams, reference numeral 21 denotes a substrate made of glass or the like and 22 indicates a lower electrode. The lower electrode 22 corresponds to the gate electrode in the sensor section in FIG. 4(B) and corresponds to the gate electrode of the TFT in FIG. 4(C).

Reference numeral 23 denotes an insulative layer made of amorphous silicon nitride (a SiN:H) containing hydrogen atoms, silicon oxide ($SiO_2$), or the like.

Reference numeral 24 denotes a photoconductive semiconductor layer made of amorphous silicon (a-Si:H) containing hydrogen atoms, or the like.

Reference numeral 25 denotes an ohmic contact layer ($n^+$ layer to obtain the ohmic contact with the upper electrode. Reference numerals 26 and 27 denotes upper electrodes which correspond to the source electrodes in the sensor section in FIG. 4(B) and correspond to the source and drain electrodes of the TFT in FIG. 4(C).

Figure 5:
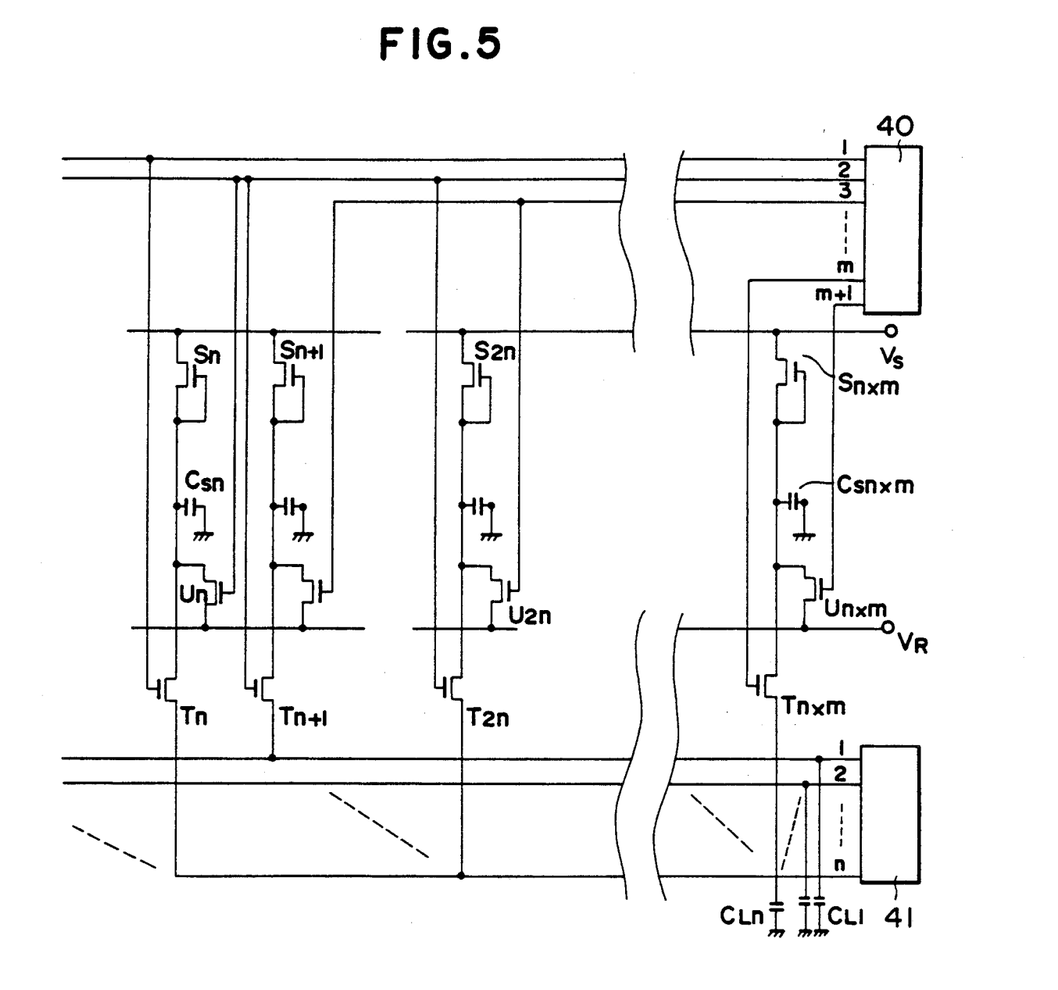
FIG. 5 is an equivalent circuit diagram of FIGS. 4(A), 4(B) and 4(C).

FIG. 5 shows an equivalent circuit of a photoelectric converting apparatus of the line sensor type in which $(n \times m)$ photoelectric converting devices shown in FIG. 4 are arranged like an array.

In the diagram, $S_1$ to $S_{n \times m}$ denote photoelectric converting sections of the TFT type: $C_{s1}$ to $C_{sn \times m}$ indicate accumulating capacitors; $U_1$ to $U_{n \times m}$ represent reset TFTs; and $T_1$ to $T_{n \times m}$ denote transfer TFTs.

The above elements groups are divided into m blocks each consisting of n elements and matrix connected to $(m+1)$ gate lines and n signal lines. Reference numeral 40 denotes a driver section to sequentially apply voltages to gate lines $V_{Gl}$ to $V_{Gm+1}$ and 41 indicate a signal processing section to take out the signal voltages of signal lines $S_l$ to $S_n$. $V_s$ denotes a sensor bias, $V_R$ indicates a reset voltage of the accumulating capacitor, and $C_{Ll}$ to $C_{Ln}$ represent load capacitors.

In this circuit, a reset TFTU is provided. After the charges in an accumulating capacitor $C_s$ was transferred, the remaining charges can be completely reset by this reset TFTU. On the other hand, a gate electrode of the reset TFTU is commonly connected to a gate electrode of a transfer TFTT in the next block. By shifting a voltage pulse in the driver section 11, a signal in the next block is transferred and at the same time, the preceding block can be reset.

The foregoing circuit can be all constructed on the same substrate. In particular, by using an a-Si:H film by the glow discharge method as a material of the photoconductive semiconductor material, the TFT type photoelectric converting section, accumulating capacitor, transfer and reset TFTs, wiring section, and the like can be realized by the simultaneous processes due to a laminated structure of the lower electrode, a-SiN:H insulative layer (silicon nitride insulative layer containing hydrogen atoms), a-Si:H layer, $n^+$ layer, and upper electrode. The electronic device including the TFT of the invention can be preferably plied to the photoelectric converting apparatus of the line sensor type due to the simultaneous processes.

As described above, according to the electronic device of the invention, even if the mask alignment is deviated in the channel direction upon patterning of the electrodes, the areas of the overlap portions among the gate electrode, the source electrode, and the drain electrode do not change, the parasitic capacitances which are respectively generated among the electrodes are held to constant values, the offset components which are applied into the output signal do not cause a large variation, and the good TFT characteristics are derived.

We claim:

1. An electronic device comprising a thin film transistor comprising:
    a substrate;
    a thin semiconductor film provided on said substrate;
    a gate electrode comprising at least two sections disposed in parallel and being electrically interconnected to each other;

a gate insulative film arranged between said thin semiconductor film and said gate electrode; and source electrode or a drain electrode, said second electrode being arranged on both sides of said gate electrode; and a third electrode comprising the other of said source electrode or said drain electrode, said third electrode being arranged between said two sections of said gate electrode, wherein at least a portion of one of said second electrode and said third electrode are overlapped with a portion of said gate electrode with respect to a plan view.

2. An electronic device comprising a thin film transistor comprising:

a thin semiconductor film formed on a substrate;

a gate insulative film formed on one surface of said thin semiconductor film;

a plurality of gate electrode portions arranged parallel to each other on said gate insulative film and electrically connected to each other, and defining a gap therebetween;

a drain electrode provided in correspondence to the gap between said gate electrode portions; and a plurality of source electrode arranged parallel to each other in correspondence to said gate electrode portions and electrically connected to each other.

3. An electronic device according to claim 2, wherein said gate electrodes have substantially a U-character shape.

4. An electronic device according to claim 2, wherein said source electrodes have substantially a U-character shape.

5. An electronic device according to claim 2, wherein said gate electrode and said source electrode have substantially a U-character shape.

6. An electronic device according to claim 2, wherein said source electrodes and/or said drain electrode are connected to said thin semiconductor film through an ohmic contact layer.

7. An electronic device according to claim 2, wherein said thin semiconductor film comprises an amorphous silicon film (a-Si film).

8. An electronic device according to claim 7, wherein said amorphous silicon film comprises hydrogen atoms (a-Si:H).

9. An electronic device according to claim 2, wherein said insulative film comprises at least a material selected from the group consisting of amorphous silicon nitride (a-SiN) and silicon oxide.

10. An electronic device according to claim 9, wherein said amorphous silicon nitride comprises hydrogen atoms (a-SiN:H).

11. An electronic device according to claim 2, wherein said thin semiconductor film is made of at least a material selected from the group consisting of germanium, silicon germanium, silicon carbide, CdS, and CdSe.

12. An electronic device according to claim 2, wherein said gate electrode comprises formed on the substrate.

13. An electronic device according to claim 2, wherein said drain electrode, said source electrodes, and said gate electrodes are formed on one side of said thin semiconductor film.

14. An electronic device according to claim 2, wherein said drain electrode and said source electrodes are formed on the side of said thin semiconductor film opposite to the side on which said gate electrodes are formed.

15. An electronic device comprising a pair of thin film transistors, said transistors each comprising:

a semiconductor layer;

an insulating layer formed on said semiconductor layer;

a first common conductive layer formed on said semiconductor layer;

source and drain electrodes patterned from said first common conductive layer;

a second common conductive layer formed on said insulating layer; and a gate electrode comprising a plurality of gate electrode portions patterned from said second common conductive layer, said gate electrode portions being formed opposite to and overlapping with said source and drain electrodes, at least a portion thereof overlapping with respect to a plan view, wherein said insulating layer is formed between at least a portion of said gate electrode portions and said source or said drain electrode, respectively, and wherein an output of one of said pair of thin film transistors due to a first parasitic capacitance of the overlap between said gate electrode portions and said drain electrode or said source electrode thereof, is compensated for by an output of the other of said pair of thin film transistors due to a second parasitic capacitance of the overlap between the said gate electrode portions and said drain electrode or said source electrode of said other of said transistors.

16. A thin film transistor comprising:

U-shaped gate electrode comprising parallel sections;

a thin semiconductor film

U-shaped electrode comprising one of a source electrode or a drain electrode, said U-shaped electrode being disposed outside of said parallel sections of said gate electrode, wherein said thin semiconductor film is disposed between said U-shaped electrode and said U-shaped gate electrode;

an additional electrode comprising the other of said drain or said source electrode, said additional electrode being disposed between said parallel sections of said gate electrode; and gate insulative film disposed between said gate electrode and said thin semiconductor film.

17. An electronic device according to claim 16, wherein an ohmic contact layer is provided between said thin semiconductor film and at least one of said source electrode and said drain electrode for providing an electrical connection.

18. An electronic device according to claim 16, wherein said thin semiconductor film comprises an amorphous silicon film.

19. An electronic device according to claim 18, wherein said amorphous silicon film comprises hydrogen atoms.

20. An electronic device according to claim 16, wherein said insulative film comprises a material selected form the consisting and amorphus silicon nitride and silicon oxide.

21. An electronic device according to claim 20, wherein said amorphous silicon nitride comprises hydrogen atoms.

22. An electronic device according to claim 16, wherein said thin semiconductor film comprises a material selected from the group consisting of germanium, silicon germanium, silicon carbide, CdS, and CdSe.

23. An electronic device according to claim 16, wherein said gate electrode is formed on the substrate.

* * * * *

UNITED STATES PATENT AND TRADEMARK OFFICE
CERTIFICATE OF CORRECTION

PATENT NO. : 5,057,889
DATED : October 15, 1991
INVENTOR(S) : KATSUHIKO YAMADA ET AL.

It is certified that error appears in the above-identified patent and that said Letters Patent is hereby corrected as shown below:

ON THE TITLE PAGE,
AT [56] REFERENCES CITED

Foreign Patent Documents,
        "58-219817  6/1985   Japan" should read
        --60-111472  6/1985  Japan--.

Insert, --Attorney, Agent, or Firm—Fitzpatrick, Cella
        Harper & Scinto--.

ON THE TITLE PAGE,
AT [76] INVENTORS

"[76] Inventors:
    Katsuhiko Yamada; Toshihiro Saika, both of c/o Canon
    Kabushiki Kaisha: 30-2, 3-chome, Shimomaruko, Ohta-ku,
    Japan" should read
    --[75] Inventors:
      Katsuhiko Yamada, Atsugi; Toshihiro Saika, Hiratsuka,
      both of Japan--.

ON THE TITLE PAGE,
AT [57] ABSTRACT

Line 11, "gage," should read --gate,--.

COLUMN 1

Line 5, "division," should be deleted.
    Line 12, "having" should read --comprises--.
    Line 16, "of" should read --or--.
    Line 27, "electrode 4" should read --electrode 4,--.
    Line 29, "so-called a" should read -a so-called--.
    Line 33, "film 1." should read --substrate 1.--.
    Line 44, "overlapped," should read --overlapped, and--.
    Line 53, "variation" should read --variation,--.

UNITED STATES PATENT AND TRADEMARK OFFICE
CERTIFICATE OF CORRECTION

PATENT NO. : 5,057,889

DATED : October 15, 1991

INVENTOR(S) : KATSUHIKO YAMADA ET AL.

It is certified that error appears in the above-identified patent and that said Letters Patent is hereby corrected as shown below:

COLUMN 2

Line 11, "surface" should read --surfaces--.
    Line 14, "cross sectional" should read --cross-sectional--.
    Line 26, "cross sectional" should read --cross-sectional--.
    Line 49, "5000 ÅA" should read --5000 Å--.
    Line 51, "(a Si:H)" should read --(a-Si:H)--.
    Line 54, "aluminum" should read --aluminum 15--.
    Line 66, "capacitance" should read --capacitances--.

COLUMN 3

Line 13, "A" should read --The--.
    Line 41, "is directly come" should read --directly comes--.
    Line 67, "(a SiN:H)" should read --(a-SiN:H)--.
    Line 68, "silicon oxide ($SiO_2$)," should read --silicon dioxide ($SiO_2$),--.

COLUMN 4

Line 5, "($n^+$layer to obtain the ohmic contact" (second occurrence) should read --($n^+$layer)--.
    Line 6, "denotes" should read --denote--.
    Line 22, "indicate" should read --indicates--.
    Line 28, "was" should read --were--.

UNITED STATES PATENT AND TRADEMARK OFFICE
CERTIFICATE OF CORRECTION

PATENT NO. : 5,057,889

DATED : October 15, 1991

INVENTOR(S) : KATSUHIKO YAMADA ET AL.

It is certified that error appears in the above-identified patent and that said Letters Patent is hereby corrected as shown below:

COLUMN 5

Line 2, "electrode; and" should read
--electrode; and
¶ a second electrode comprising one of a--.
Line 24, "electrode" should read --electrodes--.
Line 58, "comprises" should read --is--.

COLUMN 6

Line 32, "film" should read --film;--.
Line 57, "form" should read --from-- and
"the consisting and amporphus" should read
--the group consists of amorphous--.

Signed and Sealed this

Twenty-fifth Day of August, 1992

*Attest:*

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO.  : 5,057,889
DATED       : October 15, 1991
INVENTOR(S) : Katsuhiko Yamada, et. al.

It is certified that error appears in the above-indentified patent and that said Letters Patent is hereby corrected as shown below:

On the Title page, item [73], Assignee:   Insert, --Canon Kabushiki Kaisha, Tokyo, Japan--.

Signed and Sealed this

Twenty-eighth Day of September, 1993

Attest:

BRUCE LEHMAN

*Attesting Officer*                *Commissioner of Patents and Trademarks*